(12) United States Patent
Barth et al.

(10) Patent No.: US 6,753,713 B1
(45) Date of Patent: Jun. 22, 2004

(54) SYSTEM AND METHOD FOR EXPANDING A PULSE WIDTH

(75) Inventors: Severin Barth, Fontaine-les-Dijon (FR); Fabrice Picot, Mallemort (FR); Philippe Coll, Pourcieux (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/379,484

(22) Filed: Mar. 3, 2003

(30) Foreign Application Priority Data

Dec. 2, 2002 (FR) .......................................... 02 15156

(51) Int. Cl.$^7$ .............................................. H03K 3/017
(52) U.S. Cl. ..................................... 327/174; 327/172
(58) Field of Search ................................ 327/172, 174, 327/175

(56) References Cited

U.S. PATENT DOCUMENTS

| | | | |
|---|---|---|---|
| 5,793,699 A | 8/1998 | Pascucci | 365/233.5 |
| 5,856,753 A * | 1/1999 | Xu et al. | 327/175 |
| 5,898,242 A * | 4/1999 | Peterson | 327/278 |
| 6,346,841 B2 * | 2/2002 | Kim | 327/172 |
| 6,369,615 B1 * | 4/2002 | Shimizu et al. | 326/93 |
| 6,689,637 B2 * | 2/2004 | Park | 438/118 |

FOREIGN PATENT DOCUMENTS

JP        61177019        8/1986

* cited by examiner

Primary Examiner—Dinh T. Le
(74) Attorney, Agent, or Firm—Thomas Schneck; Nissa M. Strottman

(57) ABSTRACT

A circuit and method for expanding the pulse width of a signal based on the input signal's pulse width. A circuit generates a delay equal to the pulse width of the input signal for both a SHIFT and OUT signal, which are out of phase with each other. The delay is generated when a capacitor applies voltage to two control transistors in both the SHIFT and OUT blocks, reducing gate control in these transistors and generating a delay in the falling edge of these signals such that the pulse width of the SHIFT signal is reduced and the pulse width of the OUT signal is increased. The capacitor is charged by a transistor activated by the SHIFT signal. The pulse-doubling system is self-converging: when the SHIFT signal's pulse width is zero, the OUT signal's pulse width is doubled, and the capacitor's charging level is fixed since it is no longer charged by the transistor controlled by the SHIFT signal. The circuit may be modified so that the output signal's pulse width is a known factor of multiplication wider than the input signal's pulse width.

41 Claims, 3 Drawing Sheets

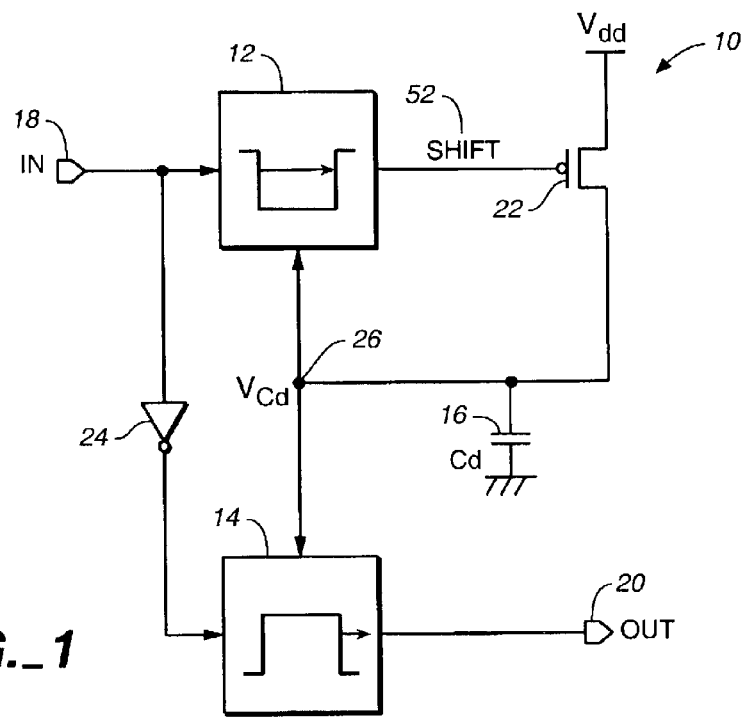
FIG._1
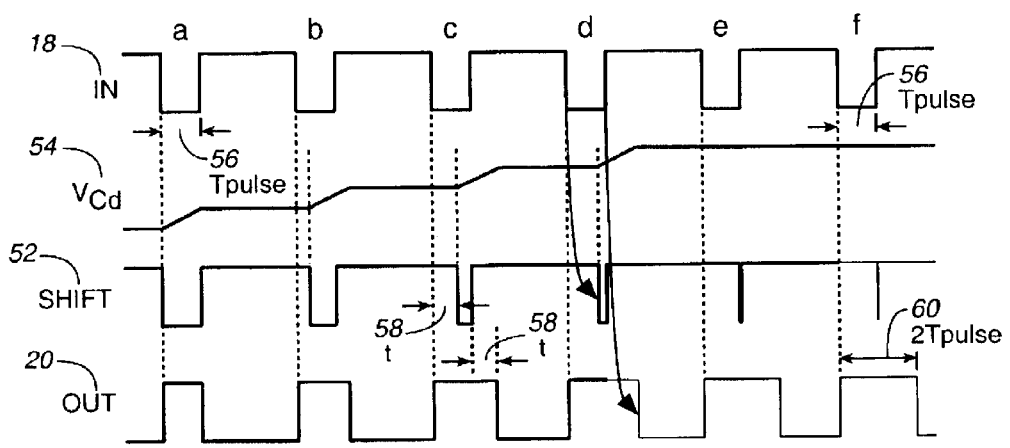
FIG._2

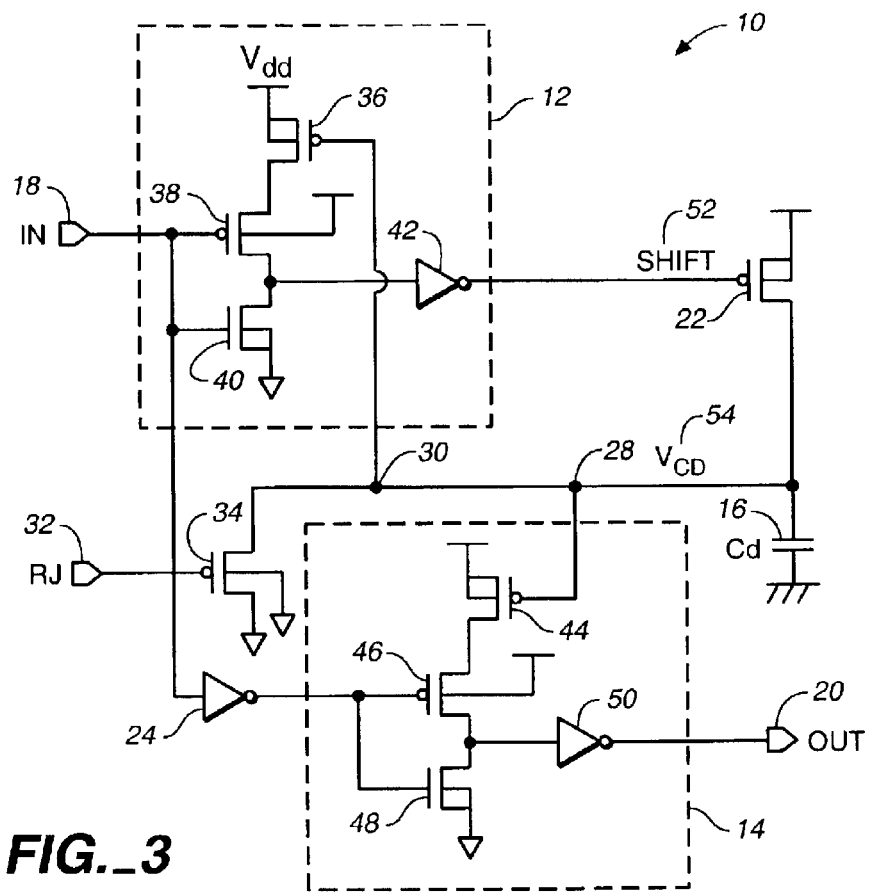
FIG._3
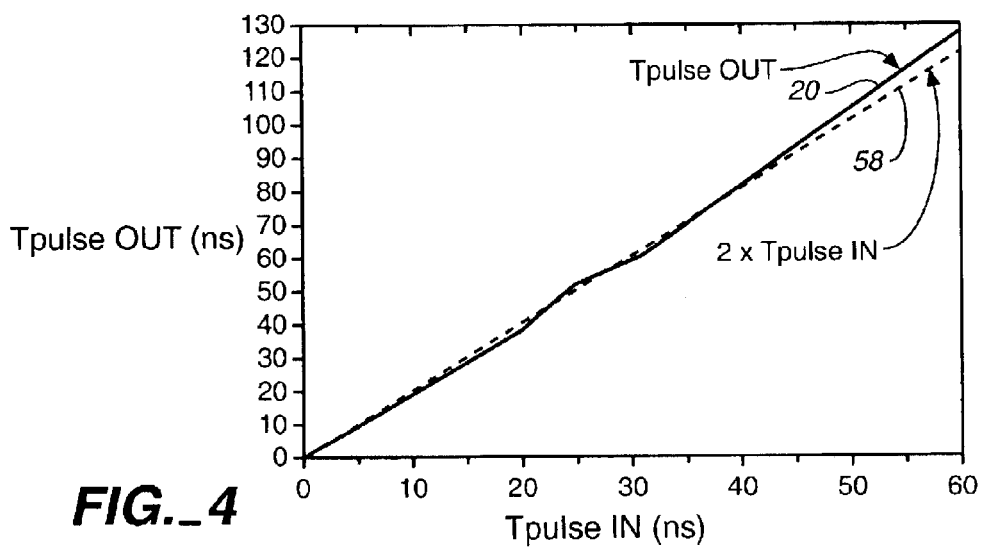
FIG._4

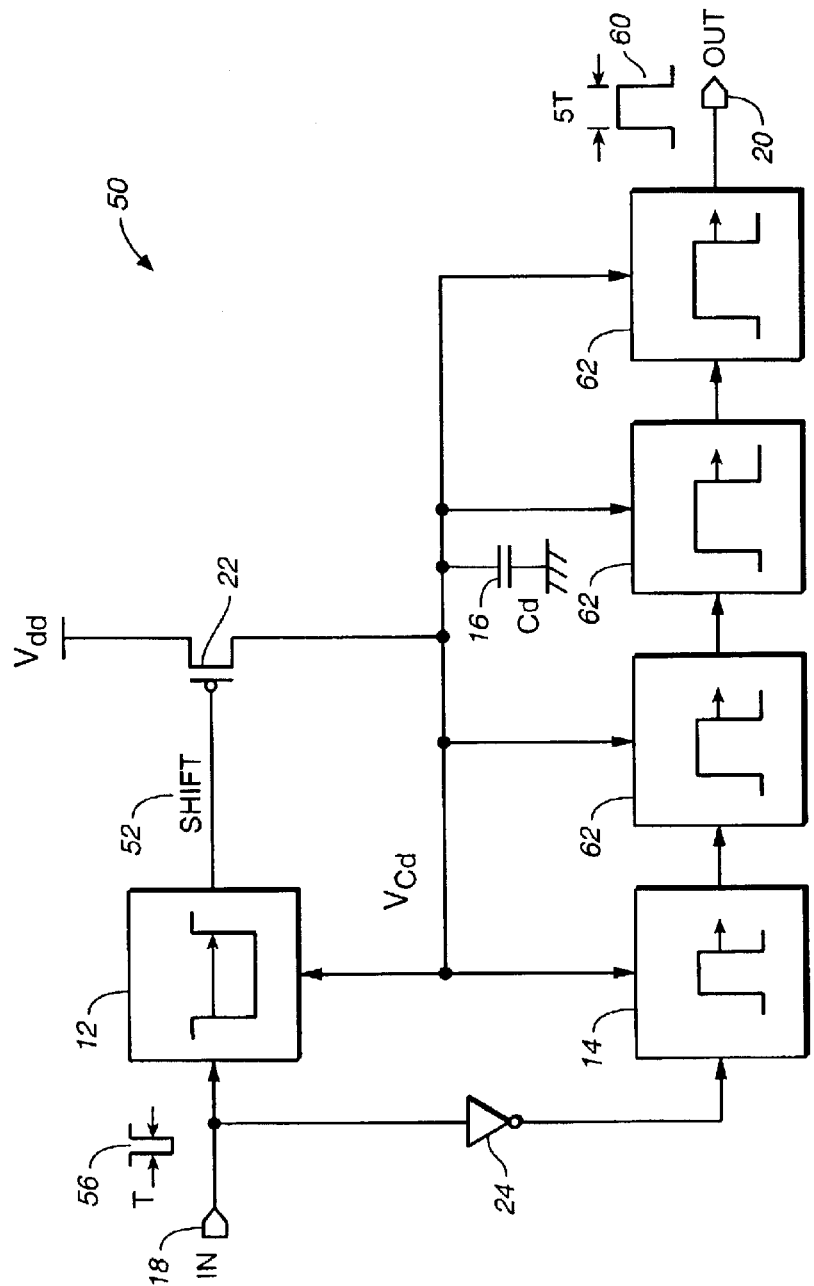
FIG._5

SYSTEM AND METHOD FOR EXPANDING A PULSE WIDTH

FIELD OF THE INVENTION

This invention relates to a circuit for generating a delay in a periodic pulse such that the pulse width is expanded by a chosen factor of multiplication.

BACKGROUND OF THE INVENTION

The components of semiconductor devices are controlled by various signals. The pulse width of these signals is often quite important for the proper operation of the components and the semiconductor device.

For instance, in asynchronous SRAM devices the Edge Transition Detection (ETD) signal is often used as the internal clock of the device, allowing the device to operate internally in a synchronous manner. If the pulse width of the ETD signal is too wide or too narrow, the memory device will not be able to function properly.

Address transition detection (ATD) circuits are used to detect a change in user-supply address bits in memory devices. The pulse from the ATD circuit is often used to precharge the data path to and from the memory address for the transfer of data. If the ATD signal pulse width is too narrow, the pulse is insufficient to precharge the data path.

It would be desirable to be able to modulate the pulse width of a signal so the signal could be used to accurately serve as a device's internal clock or detect an address transition and precharge a memory. Expanding a narrow pulse width would also be useful for measuring signals with narrow pulse widths.

The prior art has addressed controlling pulse widths. For instance, U.S. Pat. No. 5,995,444 to McClure discusses controlling the width of an ETD pulse of a memory device by varying the logic state of one or more control signals of the memory device. By changing the combination of logic states of the control signals, the pulse width of the ETD signal may be varied to produce an optimal ETD pulse width.

U.S. Pat. No. 5,706,246 to Choi et al. discusses producing an ATD signal of sufficient width to stably operate an internal circuit. An input signal is delayed until its pulse width is of sufficient duration to prevent malfunction of a memory device.

The prior art discussed here discusses expanding pulse widths by determining the desired pulse width and then varying the input signal to produce the desired pulse width. The output pulse width is not dependent on the input pulse width. The prior art discussed here does not provide a mechanism for multiplying the width of the input signal by a known factor.

It is an object of this invention to provide a method and system for expanding an input signal's pulse width by a known factor.

SUMMARY OF THE INVENTION

The object is achieved by a circuit which generates a delay equal to the pulse width of the input signal for both a SHIFT and OUT signal, which are out of phase with each other. The delay is generated when a capacitor applies voltage to two control transistors in both the SHIFT and OUT blocks, reducing gate control in these transistors and generating a delay in the falling edge of these signals such that the pulse width of the SHIFT signal is reduced and the pulse width of the OUT signal is increased. The capacitor is charged by a transistor activated by the SHIFT signal. The pulse-doubling system is self-converging: when the SHIFT signal's pulse width is zero, the OUT signal's pulse width is doubled, and the capacitor's charging level is fixed since it is no longer charged by the transistor controlled by the SHIFT signal. The circuit may be modified to provide greater pulse width expansion. This circuit may be employed in CMOS submicron technologies.

BRIEF DESCRIPTION OF THE DRAWINGS

FIG. 1 is a schematic diagram of a pulse width doubling system.

FIG. 2 is a time chart showing how the pulse widths of SHIFT and OUT signals are affected by the pulse width doubling system shown in FIG. 1.

FIG. 3 is a circuit diagram of the pulse width doubling system shown in FIG. 1.

FIG. 4 is a graph plotting the performance of the pulse width doubling system.

FIG. 5 is a schematic diagram of an expanded width generator multiplier chain.

DESCRIPTION OF THE INVENTION

In FIG. 1, one embodiment of a pulse width doubling system 10 contains two blocks or modules 12, 14. One block 12 is a shifting block producing a SHIFT signal 52, the other block 14 produces the OUT signal 20; the SHIFT 52 and OUT 20 signals are produced in response to an input signal 18, in this case a low state input pulse. The input signal 18 passes through an inverting amplifier 24 before reaching the output block 14.

The SHIFT signal controls a transistor 22 that charges a capacitor 16. The capacitance value ranges from 2 to 5 pF and will vary with the technology used. The charge level of the capacitor ($V_{Cd}$) 16 is increased at each cycle until the SHIFT signal 52 has zero pulse width or the capacitor is discharged (both of these situations are discussed in further detail below). At each cycle, the capacitor applies charge, $V_{Cd}$, to each of the blocks 12, 14 through a gate 26, generating a delay in the falling edge of the input signal 18 to each block 12, 14. As $V_{Cd}$ increases, the falling edge of the SHIFT signal 52 is delayed more and more until the low state pulse on SHIFT disappears. When this occurs, the transistor 22 no longer loads the capacitor 16. In addition, when the SHIFT signal 52 has a pulse width of zero, a delay equal to the width of the input pulse 18 has been generated at both blocks 12, 14 and the width of the OUT pulse 20 is therefore doubled.

In FIG. 2, the input pulse 18, $V_{Cd}$ 54, SHIFT signal 52, and OUT signal 20 are shown over the course of several cycles. At cycle a, when low state input pulse 18 of width T 56 is received, $V_{Cd}$ 54 is increased. At cycle b, $V_{Cd}$ 54 continues to increase, SHIFT signal 52 shows a delay on its falling edge, and OUT signal 20 shows a similar delay on its falling edge. The delays on the SHIFT and OUT signals 52, 20 are due to $V_{Cd}$ 54 being applied to the blocks responsible for generating the signals 52, 20. As $V_{Cd}$ 54 is increased in cycle c, the delay t 58 in the falling edges of the SHIFT and OUT signals 52, 20 also continues to increase. This pattern is continued in cycle d; as the pulse width on the SHIFT signal 52 decreases, the pulse width of the OUT signal 20 increases. At cycle e, the SHIFT 52 pulse width is zero; therefore the transistor controlled by the SHIFT signal no longer loads the capacitor. A delay equal to the width of the input pulse 18 has been generated for both the SHIFT and OUT signals 52, 20. As shown at cycle f, when the delay generated for the SHIFT pulse 52 is sufficient to create zero pulse width, the delay generated for the OUT pulse 20 doubles the pulse width 60 of the OUT signal.

With respect to FIG. 3, the SHIFT block 12 in this embodiment of a pulse width doubling system contains a control transistor 36, an inverter p-channel transistor 38, and an inverter n-channel transistor 40. The signal produced by these transistors 36, 38, 40 passes through an inverting amplifier 42. The output block 14 also has a control transistor 44, an inverter p-channel transistor 46, and an n-channel transistor 48. The signal from these transistors 44, 46, 48 passes through an inverting amplifier 50. The transistors 36, 44 in each block 12, 14 which are charged by the capacitor 16 should be the same size in order to generate the same delay at each cycle.

As noted above, the SHIFT signal 52 produced by the SHIFT block 12 activates a transistor 22 (in one embodiment, a PMOS transistor) that charges the capacitor 16. Voltage from the capacitor 16, $V_{cd}$ 54, is applied to the SHIFT and output blocks' 12, 14 control transistors 36, 44 at gates 30, 28. The applied voltage activates the blocks' 12, 14 control transistors 36, 44. This affects the signal processing carried out by each block's 12, 14 inverter transistors 38, 40, 46, 48, causing a delay to be added to the SHIFT or OUT pulse produced by each block 12, 14.

If the pulse width doubling system 10 receives a reset signal 32, the capacitor 16 is drained through transistor 34. After the capacitor 16 is drained, the system is reset because the capacitor 16 is no longer carrying sufficient charge to affect the SHIFT and OUT signals generated by the SHIFT and OUT blocks 12, 14. As described above, the capacitor's 16 charge is increased with each pulse of the SHIFT signal until the SHIFT signal's pulse width is zero.

In FIG. 4, the OUT signal 20 produced by the pulse width doubling system is compared to a value 58 equal to two times the width of the input signal over a range of input signals from 100 ps to 60 ns. These results are from a HSPICE simulation of the pulse width doubling system in a 0.25 $\mu$m process. The pulse width doubling system shows an error of less than 1% for pulses less than 40 ns and an error of 4% for pulses exceeding 40 ns.

The pulse width doubling system, or circuit, described above can be used for $2_N$ pulse width multiplication, which would allow the direct observation of the crosstalk-induced signal at the output pad. In order to achieve $2_N$ pulse width multiplication, $2_N$ capacitance must be provided.

As shown in FIG. 5, the circuit 50 could be modified somewhat by providing a cascade of several delay blocks 62 (half double-width generators which add a delay equal to the width 56 of the input signal T) along with the delay blocks (the SHIFT block 12 and the OUT block 14) from double width generator described above in FIGS. 1 and 3. Only one capacitor 16 is necessary in this configuration. This modified circuit produces NT pulse width multiplication, where N is the number of blocks employed and T is the pulse duration. Three delay blocks 62 are used in addition to the SHIFT 12 and OUT 14 blocks, for a total of five blocks in the system; therefore, the pulse width 60 is quintupled. Any other number of delay blocks may be used in other embodiments to expand a pulse width with the desired amount.

What is claimed is:

1. A circuit for extending a pulse width comprising:
   a) a first means for generating a pulse-type shift signal in response to an input signal;
   b) a second means for generating a pulse-type output signal in response to the input signal; and
   c) a capacitor charged by a transistor activated by the shift signal, the capacitor electrically coupled to the first means and the second means and applying charge at each cycle to the first and second means, the applied charge generating a first delay in a falling pulse edge of the shift signal and a second delay in a falling edge of the output signal such that an output signal's pulse width is expanded while a shift signal's pulse width is decreased.

2. The circuit of claim 1 further comprising a reset means electrically coupled to the capacitor, wherein the reset means discharges the capacitor when the circuit receives a reset signal.

3. The circuit of claim 1 wherein the transistor is a PMOS transistor.

4. The circuit of claim 1 wherein the output signal's pulse width is doubled when the shift signal's pulse width is zero.

5. The circuit of claim 1 further comprising at least one additional delay block electrically coupled to the capacitor, wherein the output signal's pulse width is increased for every additional delay block.

6. The circuit of claim 5 wherein the at least one additional delay block is a half double-width generator having means for adding a delay to the output signal equal to the width of the input signal.

7. A circuit for extending a pulse width comprising:
   a) a capacitor charged by a first control transistor;
   b) a shift signal means electrically coupled to the capacitor, the shift signal means producing a pulse-type shift signal in response to an input signal, the shift signal means having a second control transistor, wherein a gate of the second control transistor is controlled by a charging level of the capacitor, the second control transistor adding a first delay to an input signal's falling edge to produce the shift signal, the first delay added to the shift signal until a pulse width of the shift signal is zero; and
   c) an output signal means electrically coupled to the capacitor, the output signal means producing a pulse-type output signal in response to the input signal, the output signal means having a third control transistor, wherein a gate of the third control transistor is controlled by the charging level of the capacitor, the third control transistor adding a second delay to an output signal's falling edge, wherein the second delay is equal to the first delay such that an output signal's pulse width is expanded while the shift signal's pulse width is decreased.

8. The circuit of claim 7 further comprising a reset means electrically coupled to the capacitor, wherein the reset means discharges the capacitor when the circuit receives a reset signal.

9. The circuit of claim 7 wherein the first control transistor is a PMOS transistor.

10. The circuit of claim 7 wherein the shift signal activates the first control transistor.

11. The circuit of claim 10 wherein the first control transistor ceases to charge the capacitor when the pulse width of the shift signal is zero.

12. The circuit of claim 7 wherein the size of the second control transistor and the third control transistor is identical.

13. The circuit of claim 7 further comprising an inverting amplifier for inverting the input signal directed to the output signal means.

14. The circuit of claim 7 wherein the shift signal means further comprises an inverter p-channel transistor electrically coupled to the second control transistor.

15. The circuit of claim 14 wherein the shift signal means further comprises an inverter n-channel transistor electrically coupled to the inverter p-channel transistor.

16. The circuit of claim 14 wherein the shift signal means further comprises an inverting amplifier electrically coupled to the inverter p-channel transistor.

17. The circuit of claim 7 wherein the output signal means further comprises an inverter p-channel transistor.

18. The circuit of claim 17 wherein the output signal means further comprises an inverter n-channel transistor electrically coupled to the inverter p-channel transistor.

19. The circuit of claim 17 wherein the output signal means further comprises an inverting amplifier electrically coupled to the inverter p-channel transistor.

20. The circuit of claim 7 wherein the output signal's pulse width is doubled when the shift signal's pulse width is zero.

21. The circuit of claim 7 further comprising at least one additional delay block electrically coupled to the capacitor, wherein the output signal's pulse width is increased for every additional delay block.

22. The circuit of claim 21 wherein the at least one additional delay block is a half double-width generator having means for adding a delay to the output signal equal to the width of the input signal.

23. A circuit having an input and an output for extending a pulse width comprising:
   a) a capacitor electrically coupled to a first control transistor which charges the capacitor;
   b) a shift signal block for producing a shift signal, the shift signal block receiving an input signal and having a second control transistor electrically coupled to:
      i) the capacitor which applies charge to a gate of the second control transistor, the charge causing a first delay to be added to a falling edge of a shift signal produced in response to the input signal; and
      ii) the first control transistor, whereby a pulse of the shift signal activates the first control transistor; and
   c) an output block for producing an output signal, the output block having a third control transistor electrically coupled to the capacitor which applies charge to a gate of the third control transistor, the charge causing a second delay to be added to a falling edge of the output signal such that an output signal's pulse width is expanded while a shift signal's pulse width is decreased.

24. The circuit of claim 23 further comprising a reset means electrically coupled to the capacitor, wherein the reset means discharges the capacitor when the circuit receives a reset signal.

25. The circuit of claim 23 wherein the first control transistor is a PMOS transistor.

26. The circuit of claim 23 wherein the size of the second control transistor and the third control transistor is identical.

27. The circuit of claim 23 further comprising an inverting amplifier for inverting the input signal directed to the output block.

28. The circuit of claim 23 wherein the shift signal block further comprises an inverter p-channel transistor electrically coupled to the second control transistor.

29. The circuit of claim 28 wherein the shift signal block further comprises an inverter n-channel transistor electrically coupled to the inverter p-channel transistor.

30. The circuit of claim 28 wherein the shift signal block further comprises an inverting amplifier electrically coupled to the inverter p-channel transistor.

31. The circuit of claim 23 wherein the output signal block further comprises an inverter p-channel resistor.

32. The circuit of claim 31 wherein the output block further comprises an inverter n-channel transistor electrically coupled to the inverter p-channel transistor.

33. The circuit of claim 31 wherein the output block further comprises an inverting amplifier electrically coupled to the inverter p-channel resistor.

34. The circuit of claim 23 wherein the output signal's pulse width is doubled when the shift signal's pulse width is zero.

35. The circuit of claim 23 further comprising at least one additional delay block electrically coupled to the capacitor, wherein the output signal's pulse width is increased for every additional delay block.

36. The circuit of claim 35 wherein the at least one additional delay block is a half double-width generator having means for adding a delay to the output signal equal to the width of the input signal.

37. A method of extending a periodic pulse comprising:
   a) receiving a low state input pulse at a shift signal block generating a shift signal and an output block generating an output signal;
   b) charging a capacitor with a transistor activated by the shift signal;
   c) applying charge from the capacitor to both the shift signal block and the output block, wherein a delay in a falling edge of the shift signal and output signal is generated; and
   d) repeating steps a–c at each cycle, wherein the capacitor is no longer charged when there is no pulse on the shift signal.

38. The method of claim 37 further comprising discharging the capacitor when a reset signal is received.

39. The method of claim 37 wherein a generated delay in the shift signal equal to the initial width of the input pulse results in a zero pulse width of the shift signal.

40. The method of claim 37 wherein the output pulse is doubled when there is no pulse on the shift signal.

41. The method of claim 37 further comprising applying charge from the capacitor to at least one additional delay block, wherein the output signal is expanded for each additional delay block receiving charge from the capacitor.

* * * * *